(12) United States Patent
Cao et al.

(10) Patent No.: US 9,287,516 B2
(45) Date of Patent: Mar. 15, 2016

(54) FORMING PN JUNCTION CONTACTS BY DIFFERENT DIELECTRICS

(71) Applicant: INTERNATIONAL BUSINESS MACHINES CORPORATION, Armonk, NY (US)

(72) Inventors: Qing Cao, Yorktown Heights, NY (US); Shu-jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/618,618

(22) Filed: Feb. 10, 2015

(65) Prior Publication Data

US 2015/0287942 A1    Oct. 8, 2015

Related U.S. Application Data

(60) Provisional application No. 61/976,188, filed on Apr. 7, 2014.

(51) Int. Cl.
| | |
|---|---|
| *H01L 51/00* | (2006.01) |
| *H01L 51/05* | (2006.01) |
| *H01L 51/10* | (2006.01) |
| *H01L 29/06* | (2006.01) |
| *H01L 21/02* | (2006.01) |

(52) U.S. Cl.
CPC ...... *H01L 51/0541* (2013.01); *H01L 21/02606* (2013.01); *H01L 29/0665* (2013.01); *H01L 29/0669* (2013.01); *H01L 29/0673* (2013.01); *H01L 51/002* (2013.01); *H01L 51/0048* (2013.01); *H01L 51/0508* (2013.01); *H01L 51/0525* (2013.01); *H01L 51/0558* (2013.01); *H01L 51/105* (2013.01); *H01L 2221/1094* (2013.01); *H01L 2251/303* (2013.01)

(58) Field of Classification Search
CPC ............ H01L 51/0048; H01L 29/0673; H01L 29/0665; H01L 51/0508; H01L 2221/1094; H01L 29/0669; H01L 21/02606
See application file for complete search history.

(56) References Cited

U.S. PATENT DOCUMENTS

| | | | | |
|---|---|---|---|---|
| 6,445,006 | B1 * | 9/2002 | Brandes et al. | 257/76 |
| 7,051,945 | B2 * | 5/2006 | Empedocles et al. | 235/492 |
| 7,064,372 | B2 * | 6/2006 | Duan et al. | 257/296 |
| 7,105,428 | B2 * | 9/2006 | Pan et al. | 438/584 |
| 7,135,728 | B2 * | 11/2006 | Duan et al. | 257/296 |
| 7,211,464 | B2 * | 5/2007 | Lieber et al. | 438/99 |
| 7,254,151 | B2 * | 8/2007 | Lieber et al. | 372/44.01 |
| 7,335,908 | B2 * | 2/2008 | Samuelson et al. | 257/12 |

(Continued)

OTHER PUBLICATIONS

List of IBM Patents or Patent Applications Treated as Related; (Appendix P), Filed Jun. 17, 2015, 2 pages.

(Continued)

*Primary Examiner* — Ngan Ngo
(74) *Attorney, Agent, or Firm* — Cantor Colburn LLP; Vazken Alexanian

(57) ABSTRACT

A carbon nanotube transistor and method of manufacturing a carbon nanotube transistor is disclosed. The carbon nanotube transistor includes a carbon nanotube on a substrate, a gate electrode deposited on the carbon nanotube, and at least one of a source electrode and a drain electrode deposited on the carbon nanotube and separated from the gate electrode by a space region. The carbon nanotube is doped at the gate electrode an in the space region to form a p-n junction.

12 Claims, 5 Drawing Sheets

(56) References Cited

U.S. PATENT DOCUMENTS

| | | | |
|---|---|---|---|
| 7,619,562 B2* | 11/2009 | Stumbo et al. | 342/372 |
| 7,782,650 B2* | 8/2010 | Bertin et al. | 365/148 |
| 7,846,756 B2 | 12/2010 | Yen et al. | |
| 8,003,453 B2 | 8/2011 | Avouris et al. | |
| 8,030,186 B2* | 10/2011 | Romano et al. | 438/478 |
| 8,049,203 B2* | 11/2011 | Samuelson et al. | 257/9 |
| 8,124,463 B2 | 2/2012 | Chen et al. | |
| 8,217,490 B2* | 7/2012 | Bertin et al. | 257/529 |
| 8,227,817 B2* | 7/2012 | Pedersen et al. | 257/94 |
| 8,228,277 B2 | 7/2012 | Yoshida et al. | |
| 8,288,759 B2 | 10/2012 | Chen et al. | |
| 8,440,994 B2* | 5/2013 | Kastalsky | 257/12 |
| 8,513,768 B2* | 8/2013 | Bertin et al. | 257/529 |
| 2003/0122133 A1* | 7/2003 | Choi et al. | 257/77 |
| 2003/0148562 A1* | 8/2003 | Luyken et al. | 438/197 |
| 2004/0061422 A1* | 4/2004 | Avouris et al. | 313/315 |
| 2006/0063318 A1* | 3/2006 | Datta et al. | 438/197 |
| 2007/0030871 A1* | 2/2007 | Lee | 372/46.01 |
| 2007/0235076 A1* | 10/2007 | Liu et al. | 136/253 |
| 2008/0315183 A1* | 12/2008 | Kinoshita et al. | 257/24 |
| 2009/0179193 A1* | 7/2009 | Appenzeller et al. | 257/24 |
| 2009/0278192 A1 | 11/2009 | Choi et al. | |
| 2010/0127241 A1* | 5/2010 | Gruner et al. | 257/20 |
| 2011/0081770 A1* | 4/2011 | Tombler, Jr. | 438/466 |
| 2012/0301360 A1* | 11/2012 | Meinhold et al. | 422/68.1 |
| 2013/0082262 A1 | 4/2013 | Honda et al. | |
| 2015/0021607 A1* | 1/2015 | Yoon et al. | 257/57 |

OTHER PUBLICATIONS

Qing Cao et al., "Forming PN Junction Contacts by Different Dielectrics", U.S. Appl. No. 14/742,032, filed Jun. 17, 2015.

A. A. Pesetski et al.,; "A 500 MHz carbon nanotube transistor oscillator," Applied Physics Letters, vol. 93, No. 12, 2008, 123506, 2 pages.

A. D. Franklin et al.; "Carbon Nanotube Complementary Wrap-Gate Transistors," Nano Letters, vol. 13, No. 6, 2013, pp. 2490-2495.

R. Narang et al.; "Modeling and simulation of multi layer gate dielectric double gate tunnel field-effect transistor (DG-TFET)." IEEE Students' Technology Symposium (TechSym), 2011, pp. 281-285.

* cited by examiner

FORMING PN JUNCTION CONTACTS BY DIFFERENT DIELECTRICS

DOMESTIC PRIORITY

The present disclosure claims priority from U.S. Provisional Application Ser. No. 61/976,188, titled "FORMING PN JUNCTION CONTACTS BY DIFFERENT DIELECTRICS," filed on Apr. 7, 2014.

BACKGROUND

The present invention relates to carbon nanotube transistors and, in particular, to methods for reducing device OFF current and increasing the performance of carbon nanotube transistors.

Thin-film transistors are commonly used in display technologies, such as liquid crystal displays (LCD). Carbon nanotube thin-film transistors have the potential to replace standard thin-film transistors that are based on amorphous silicon or poly-silicon material. These transistors generally have higher mobility than Si-based thin-film transistors and can be fabricated with lower cost. The capability of depositing carbon nanotube thin film at room temperature allows the device fabrication on flexible substrates, enabling other new applications such as flexible electronics and displays. One important device performance parameter is the ratio between ON source-drain current (where both gate-source and drain-source biases are at full bias) and OFF source-drain current (where drain-source is at full bias and gate-source is at zero bias). Despite the abovementioned advantages of using carbon nanotube thin-film material, transistors with this material potentially suffer from larger OFF current due to Schottky barrier contacts. The ambipolar current from the thermionic emission over the Schottky barrier height greatly limits device ON/OFF ratio, in particular with a larger voltage applied between the source and the drain. Thus, improving ON/OFF ratios of carbon nanotube thin-film transistors is desired.

SUMMARY

According to one embodiment of the present invention, a carbon nanotube transistor includes: one or more carbon nanotubes; a gate structure including a gate electrode deposited on the carbon nanotube; and at least one of a source electrode and a drain electrode deposited on the carbon nanotube and separated from the gate electrode by a spacer region, wherein the carbon nanotube is doped at the gate electrode and in the space region to form a p-n junction.

According to another embodiment of the present invention, a method of making a carbon nanotube transistor includes: depositing a carbon nanotube on a substrate; depositing a gate material in a gate region; depositing at least one of a source electrode and a drain electrode on the carbon nanotube separated from the gate region by a spacer region; and doping the carbon nanotube in the gate region and in the space region to form a p-n junction along the carbon nanotube.

According to another embodiment of the present invention, a carbon nanotube transistor includes: a carbon nanotube configured to traverse a gate electrode of the transistor, at least one of a source electrode and a drain electrode of the transistor, and a space region of between the gate electrode and the at least one of the source electrode and the drain electrode, wherein the carbon nanotube is doped at the gate region and in the space region to form a p-n junction.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 shows an illustrative carbon nanotube transistor in one embodiment of the present invention;

FIGS. 3-9 illustrate various steps in a manufacturing process that produces the illustrative transistor of FIG. 2, wherein:

FIG. 3 shows a first step in the manufacturing process in which a substrate is formed;

FIG. 4 shows a second manufacturing step in which a carbon nanotube is deposited on the silicon substrate;

FIG. 5 shows a third manufacturing step in which source electrode and drain electrode are deposited;

FIG. 6 shows a fourth manufacturing step in which a first dielectric is deposited on the substrate;

FIG. 7 shows a fifth manufacturing step in which a gate material is deposited on the first dielectric to form a gate electrode;

FIG. 8 shows a sixth manufacturing step in which the first dielectric is etched;

FIG. 9 shows a seventh manufacturing step in which a second dielectric and is formed in gaps between the gate electrode and the source and drain electrodes.

DETAILED DESCRIPTION

Figure 1:
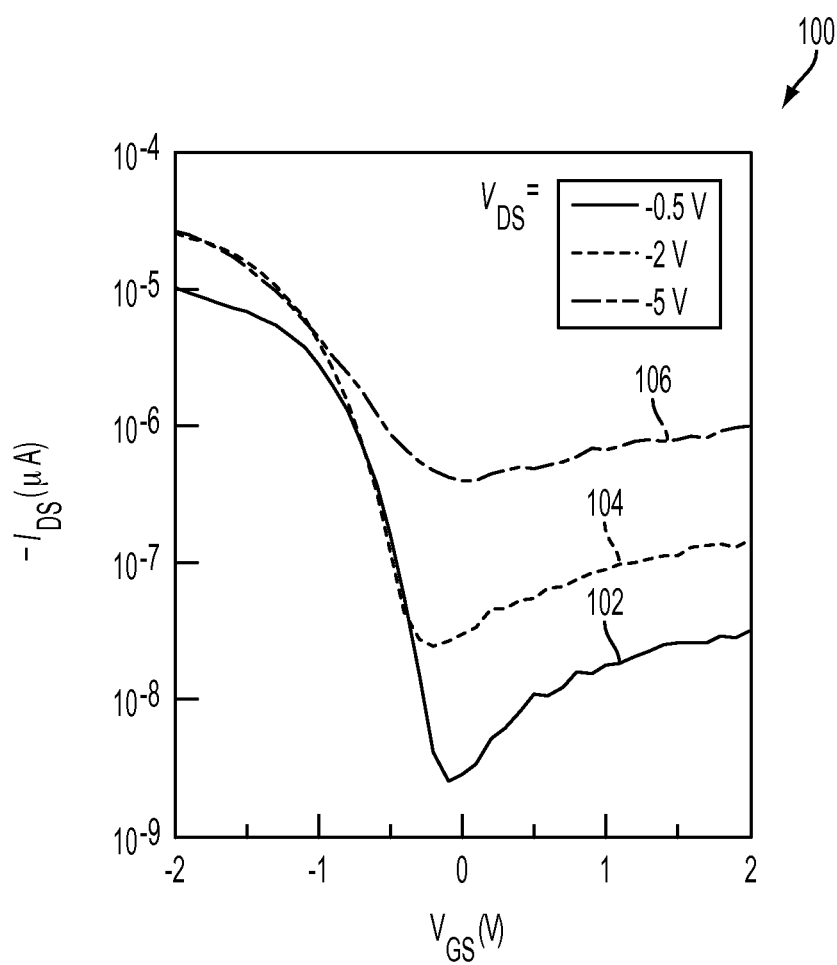
FIG. 1 shows a relation between drain-source current and gate-source voltage that occurs in common transistor assemblies.

FIG. 1 shows a relation 100 between drain-source current and gate-source voltage that occurs in conventional carbon nanotube transistor assemblies. The drain-source current changes over several orders of magnitude with gate voltage. For example, for a drain-source bias voltage of −0.5 volts, (curve 102) the drain-source current varies between about $2 \times 10^{-9}$ microamps (μA) and about $10^{-5}$ μA. The highest current flow may be considered an expected current of the transistor when the transistor is turned on (i.e., an ON current). The lowest current flow may be considered an expected current of the transistor when the transistor is turned off (i.e., an OFF current). A ratio between the ON current and the OFF current generally describes a quality of the transistor. As the drain-source current is negatively increased, the ON current increases slightly and the OFF current increases dramatically, thereby reducing the ON/OFF ratio, as seen by curves 104 and 106. This is because, in conventional carbon nanotube transistors, a height difference of the Schottky barrier between electrons and holes suppresses ambipolar behavior of the transistor. However, high leakage current from thermionic emission through the Schottky barrier limits the device ON/OFF ratios, especially at large drain-source voltages, thereby reducing the quality of the transistor. Thus, the present invention provides a carbon nanotube transistor and method of manufacture, wherein the transistor reduces the presence of high leakage current in the transistor.

Figures 2, 3:
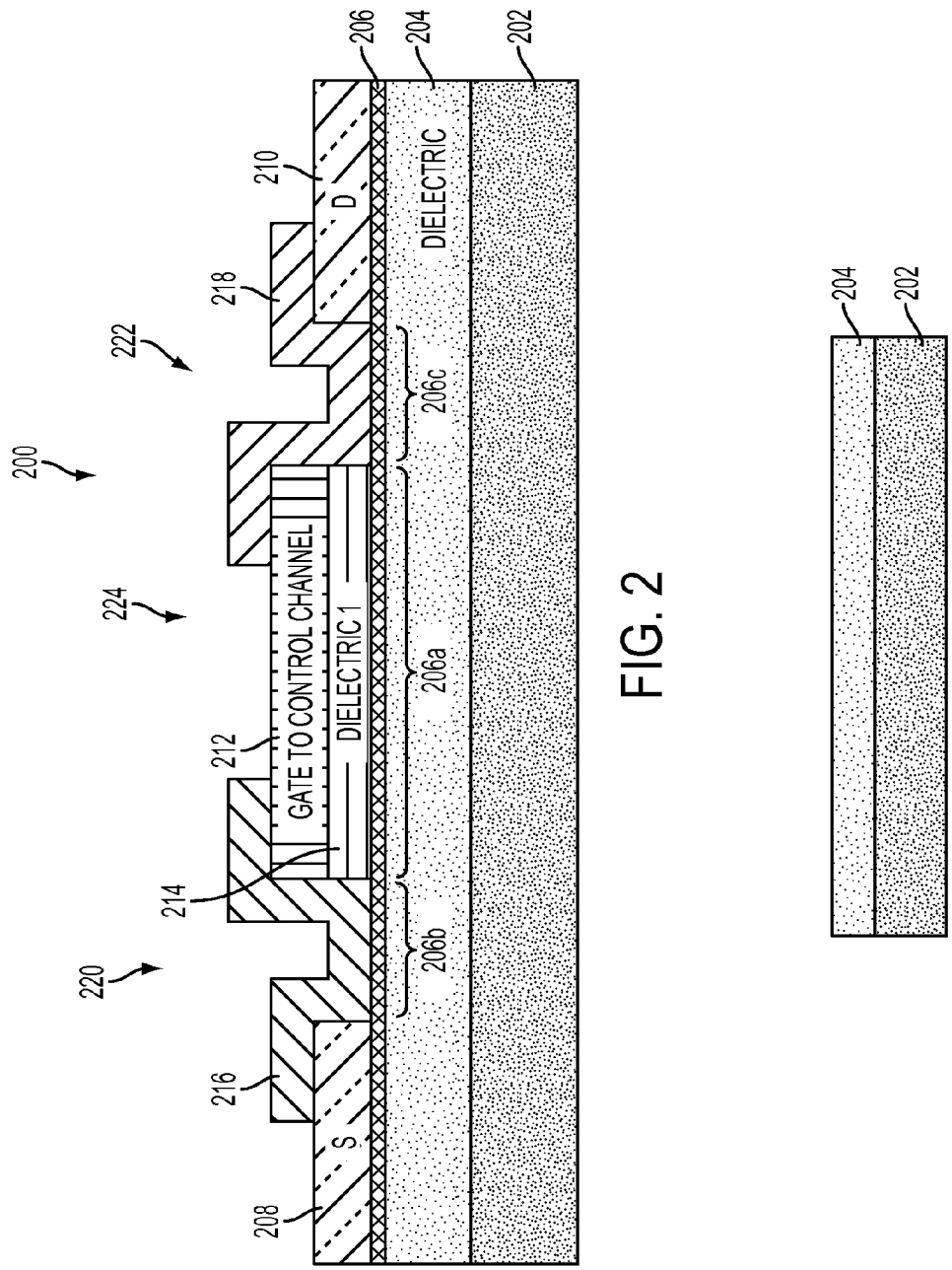

FIG. 2 shows an illustrative carbon nanotube transistor 200 in one embodiment of the present invention. The transistor 200 includes a substrate 202 and a dielectric layer 204 formed on the insulating layer 202. Substrate 202 may be made of Silicon, glass, plastic substrate such as polyimide, or other suitable material. Insulating layer 204 may be made of silicon dioxide, silicon nitride, or other dielectrics for insulating purposes. One or more carbon nanotubes 206 may be formed on the top surface of the dielectric material 204. Source electrode 208 and drain electrode 210 are deposited at opposite ends of the carbon nanotube 206 and are separated from each other by a gate channel. A gate structure 224 is formed in the gate channel so that the gate structure 224 is separated from the source electrode 208 by a first gap 220 and is separated from the drain electrode 210 by a second gap 222. In various embodiments, the length of the first gap 220 and the length of the second gap 222 is substantially the same. The gate structure 224 includes a first gate dielectric material 214 formed on the carbon nanotube 206 and a gate electrode material 212 formed on the first dielectric material 214. Dielectric 216 is formed in the first gap 220 and dielectric 218 is formed in the second gap 222. In various embodiments, the dielectrics 216 and 218 are made of the same dielectric material. Additionally, the dielectrics 216 and 218 are generally made of different dielectric material that the first dielectric 214. In one embodiment, dielectric 214 may include $AlON/HfO_2$ and dielectrics 216 and 218 may include $AlON/Al_2O_3$. In another embodiment, dielectric 214 may include $AlON/Al_2O_3$ and dielectrics 216 and 218 may include $AlON/HfO_2$.

The first dielectric 214 may be an n-type or a p-type dielectric. When the first dielectric 214 is deposited on the carbon nanotube 206, the first dielectric 214 dopes the segment 206a of the carbon nanotube 206 that is underneath the gate 224. When the second dielectrics are 216 and 218 are deposited in first gaps 220 and 222, respectively, the second dielectrics 216 and 218 dope the segments 206b and 206c. The second dielectrics 216 and 218 may be an n-type or a p-type dielectric. When the first dielectric 214 is an n-type dielectric, then the second dielectrics 216 and 218 are p-type dielectrics. Similarly, when the first dielectric 214 is a p-type dielectric, then the second dielectrics 216 and 218 are n-type dielectrics. The first and second dielectrics 214 and 216 may dope their respective segments of the carbon nanotube by electrostatic doping. In various embodiments, the first dielectric is made of AlON (aluminum oxynitride) and $HfO_2$ (hafnium oxide) stack and the second dielectric is made of AlON and $Al_2O_3$ (aluminum oxide) stack. In another embodiment, the first dielectric is made of AlON (aluminum oxynitride) and $Al_2O_3$ (aluminum oxide) stack and the second dielectric is made of AlON and $HfO_2$ (hafnium oxide) stack.

The doping design of the transistor induces a p-n junction in the carbon nanotube 206 at the transition between segments 206a and 206b. This p-n junction is at the intersection of the gate 224 and the adjoined first gap 220. Similarly a p-n junction is induced in the carbon nanotube 206 at the transition between segments 206a and 206c. This p-n junction is at the intersection of the gate electrode 224 and the adjoining second gap 222. The orientation of the p-n junction is along a longitudinal axis of the carbon nanotube 206. The presence of the p-n junction increases an ON/OFF ratio of source-drain current in the transistor with respect to a transistor that does not have the p-n junction. Therefore, the presence of the p-n junction increases performance of the transistor over a transistor without a p-n junction.

FIGS. 3-9 illustrate various steps in a manufacturing process that produces the illustrative transistor of FIG. 2. FIG. 3 shows a first step in the manufacturing process in which a substrate is formed. In various embodiments, the substrate materials may include silicon, glass, or plastic substrate such as polyimide (for providing support), dielectric layer 204 can be silicon dioxide, silicon nitride or other dielectric for insulating purposes. Dielectric layer 204 may be deposited on substrate 202 by chemical vapor deposition method, physical vapor deposition method or atomic layer deposition method or other suitable techniques.

Figure 4:
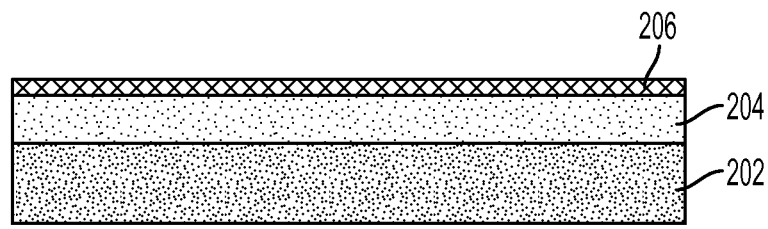

FIG. 4 shows a second manufacturing step in which carbon nanotubes 206 are deposited on the dielectric substrate 204. The carbon nanotube serves as a channel between source, gate and drain of the completed transistor.

Figure 5:
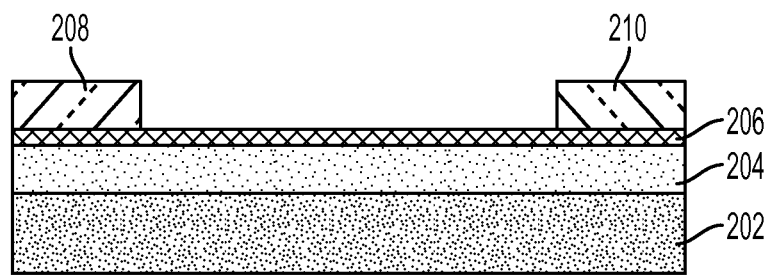

FIG. 5 shows a third manufacturing step in which source electrode 208 and drain electrode 210 are deposited. The source electrode 208 and drain electrode 210 are deposited on the substrate 204 so that a portion of the carbon nanotube 206 is sandwiched between the source electrode 208 and the substrate 204 and a portion of the carbon nanotube 206 is sandwiched between the drain electrode 210 and the substrate 204. In general, the source electrode 208 and drain electrode 210 may be made of palladium (Pd), Erbium (Er), Scandium (Sc) or other suitable materials. The source and drain electrodes 208, 210 may be formed via physical vapor deposition techniques or other suitable techniques.

Figure 6:
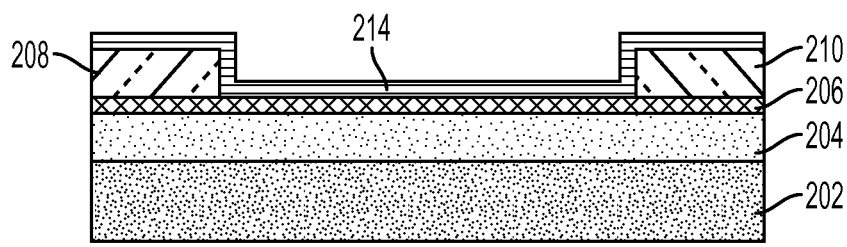

FIG. 6 shows a fourth manufacturing step in which the first dielectric 214 is deposited on the substrate. The first dielectric may cover the carbon nanotube 206 in the region between the source electrode 208 and the drain electrode 210 and may also cover source electrode 208 and/or drain electrode 210.

Figure 7:
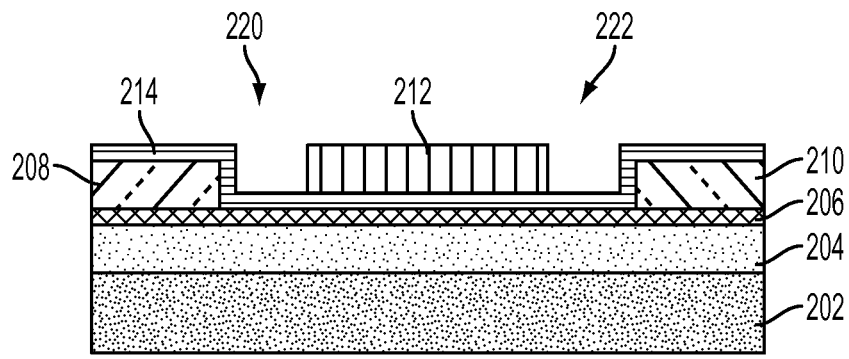

FIG. 7 shows a fifth manufacturing step in which the gate material 212 is deposited on the first dielectric 214 to form the gate electrode. The gate material 212 may be deposited using physical vapor deposition techniques or other suitable techniques. The gate material is deposited so that a first gap 220 is provided between the gate 224 and the source electrode 208 and a second gap 222 is provided between the gate 224 and the drain electrode 210.

Figure 8:
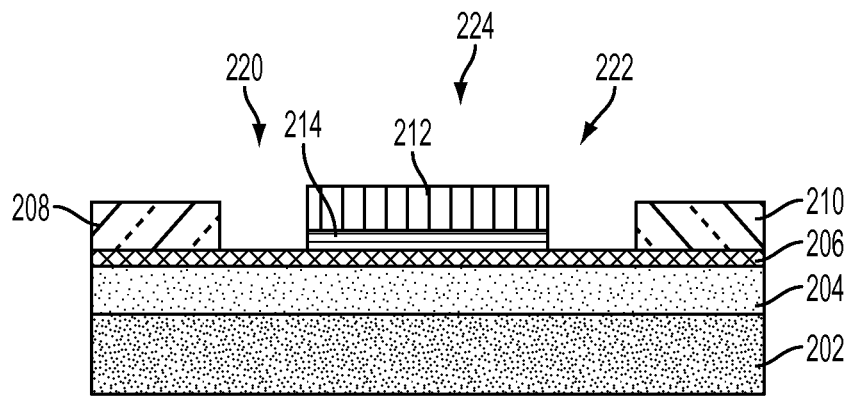

FIG. 8 shows a sixth manufacturing step in which the first dielectric 214 is etched. The gate material 212 covers a portion of the first dielectric 214 by wet etching or other suitable techniques, and only the exposed segments of the first dielectric 214 are etched during this step. Therefore, the etching process of this step leaves the first dielectric 214 between the gate material 212 and the carbon nanotube underneath the gate material 212. The carbon nanotube 206 is left exposed in the first gap 220 and in the second gap 222.

Figure 9:
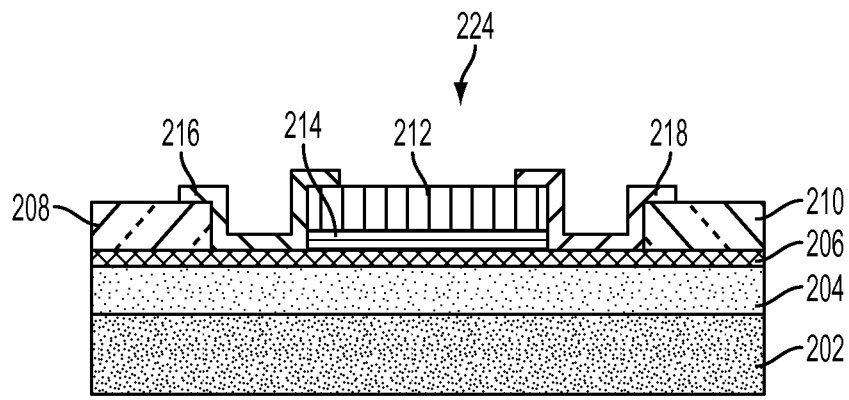

FIG. 9 shows a seventh manufacturing step in which the second dielectric 216 and 218 is formed in the gaps 220 and 222. In one embodiment, the second dielectric may be deposited to cover the source electrode 208, drain electrode 210, gate 224 and the first gap 220 and second gap 222 and an etching process may be used to remove the second dielectric from the source electrode 208, drain electrode 210 and gate electrode 212, thereby leaving second dielectrics 216 and 218 in their respective gaps 220 and 222.

Figure 10:
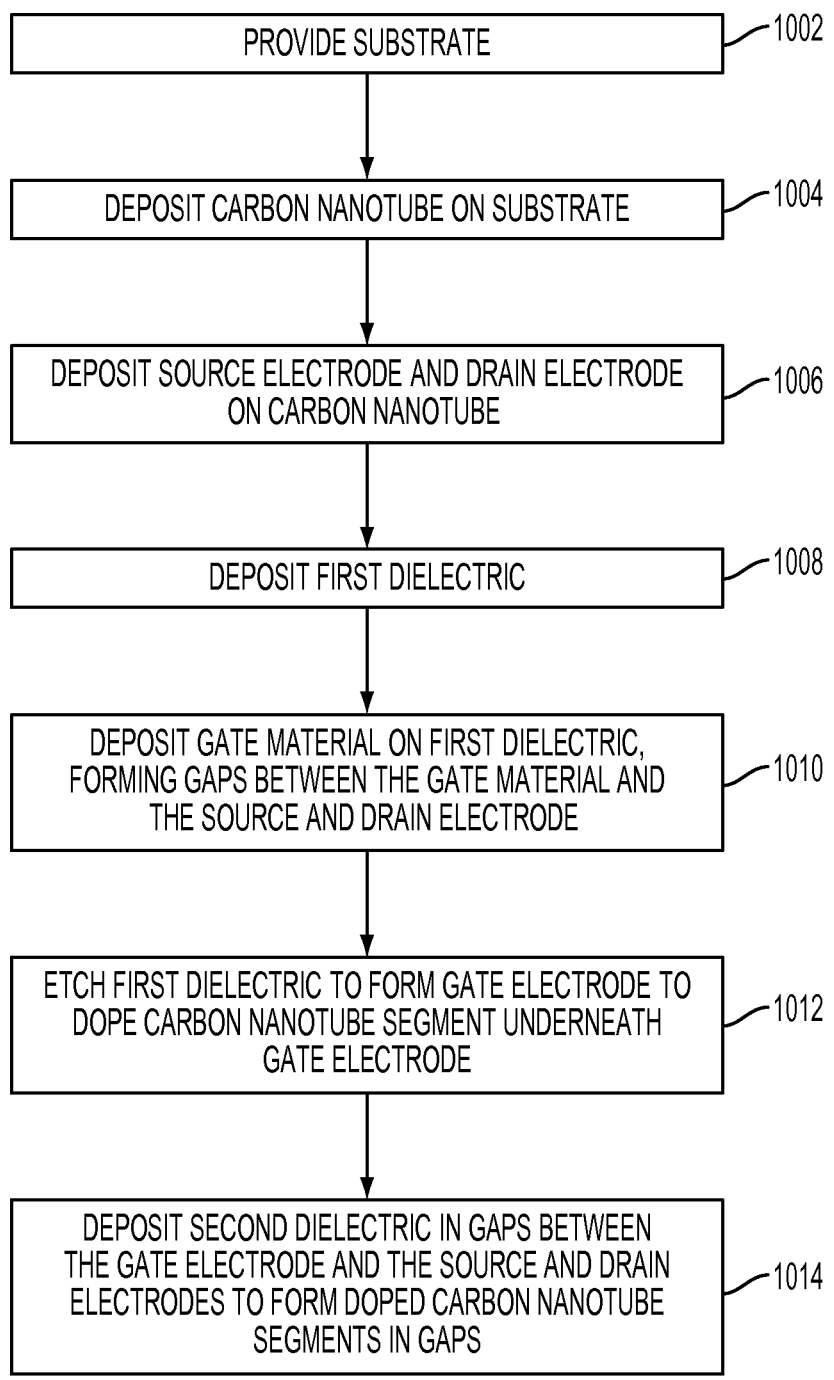
FIG. 10 shows a flowchart illustrating a method of producing the carbon nanotube transistor disclosed herein.

FIG. 10 shows a flowchart illustrating a method of producing the carbon nanotube transistor disclosed herein. In block 1002, a substrate is provided. In block 1004, carbon nanotubes are deposited on the substrate. In block 1006, source and drain electrode are deposited on top of carbon nanotubes. In block 1008, a first dielectric is deposited on the carbon nanotube between the source electrode and drain electrode. In block 1010, gate material is deposited on the first dielectric to form a gap between the gate material and the source electrode and between the gate material and the drain electrode. In block 1012, the first dielectric is etched to remove the first dielectric except from at the gate electrode. The first dielectric therefore dopes the carbon nanotube under the gate electrode. In block 1014, a second dielectric is deposited in the gaps between the gate electrode and the source and drain electrodes. The second dielectric dopes the carbon nanotube segments in the gaps. The doped segments of the carbon nanotube form a p-n junction along the carbon nanotube that increases an ON/OFF ratio of the source-drain current of the resultant transistor, thereby increasing the stability of the transistor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A carbon nanotube transistor, comprising:
    a carbon nanotubes on a substrate;
    a gate structure deposited on the carbon nanotube, wherein the gate structure include a layer of first dielectric material for doping the carbon nanotube at the gate structure;
    a source electrode deposited on one end of the carbon nanotube and separated from the gate electrode by a first gap;
    a drain electrode deposited on an opposite end of the carbon nanotube and separated from the gate electrode by a second gap;
    a layer of second dielectric material formed in the first gap for doping the carbon nanotube in the first gap, wherein the second dielectric material is different from the first dielectric material; and
    a layer of the second dielectric material formed in the second gap for doping the carbon nanotube in the second gap;
    wherein the doped carbon nanotube forms a p-n junction at a transition between the gate structure and the first gap and at a transition between the gate structure and the second gap.

2. The carbon nanotube transistor of claim 1, wherein the first doping is one of an n-type doping and a p-type doping and the second doping is the other of the n-type doping and the p-type doping.

3. The carbon nanotube transistor of claim 2, wherein the first dielectric is one of AlON and $HfO_2$ and the second dielectric is one of AlON and $Al_2O_3$.

4. The carbon nanotube transistor of claim 1 wherein at least one of the first dielectric material and the second dielectric material induces an electrostatic doping effect in the carbon nanotube.

5. The carbon nanotube transistor of claim 1, wherein the p-n junction is oriented along a longitudinal axis of the carbon nanotube.

6. The carbon nanotube transistor of claim 5, wherein the orientation of the p-n junction increases an ON/OFF ratio of a drain-source current of the transistor over an ON/OFF ratio of a transistor without the p-n junction.

7. A carbon nanotube transistor, comprising:
    a carbon nanotube configured to traverse a gate channel between a source electrode and a drain electrode of the transistor;
    a gate structure deposited on the carbon nanotube in the gate channel to provide a first gap between the gate structure and the source electrode and a second gap between the gate structure and the drain electrode, wherein the gate structure includes a first dielectric material for doping the carbon nanotube at the gate structure;
    a layer of second dielectric material formed in the first gap for doping the carbon nanotube in the first gap, wherein the second dielectric material is different from the first dielectric material; and
    a layer of the second dielectric material formed in the second gap for doping the carbon nanotube in the second gap;
    wherein the doped carbon nanotube forms a p-n junction at a transition between the gate structure and the first gap and at a transition between the gate structure and the second gap.

8. The carbon nanotube transistor of claim 7, further comprising the first dielectric material configured to provide one of an n-type doping and a p-type doping to the carbon nanotube at the gate electrode and the second dielectric material configured to provide the other of the n-type doping and the p-type doping to the carbon nanotube in the space region.

9. The carbon nanotube transistor of claim 8, wherein the first dielectric is one of AlON and $HfO_2$ and the second dielectric is one of AlON and $Al_2O_3$.

10. The carbon nanotube transistor of claim 8, wherein at least one of the first dielectric material and the second dielectric material induces an electrostatic doping effect in the carbon nanotube.

11. The carbon nanotube transistor of claim 8, wherein the p-n junction is oriented along a longitudinal axis of the carbon nanotube.

12. The carbon nanotube transistor of claim 11, wherein the orientation of the p-n junction increases an ON/OFF ratio of a drain-source current of the transistor over an ON/OFF ratio of a transistor having an undoped carbon nanotube.

* * * * *